US007429972B2

(12) United States Patent
Choi et al.

(10) Patent No.: US 7,429,972 B2
(45) Date of Patent: Sep. 30, 2008

(54) HIGH SLEW-RATE AMPLIFIER CIRCUIT FOR TFT-LCD SYSTEM

(75) Inventors: Changhwe Choi, Kyunggi-Do (KR); Jungtae Park, Kyunggi-Do (KR); Seungjung Lee, Kyunggi-Do (KR); Doyoun Kim, Kyunggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 575 days.

(21) Appl. No.: 10/658,770

(22) Filed: Sep. 10, 2003

(65) Prior Publication Data

US 2005/0052395 A1 Mar. 10, 2005

(51) Int. Cl.
*G09G 3/36* (2006.01)
*H03F 3/45* (2006.01)
*H03K 19/0175* (2006.01)

(52) U.S. Cl. ........................... 345/98; 330/255; 326/82

(58) Field of Classification Search ........... 345/87–107; 330/255
See application file for complete search history.

(56) References Cited

U.S. PATENT DOCUMENTS

| | | | | | |
|---|---|---|---|---|---|
| 5,283,477 | A * | 2/1994 | Shibata | | 327/306 |
| 5,754,078 | A * | 5/1998 | Tamagawa | | 330/255 |
| 6,028,598 | A * | 2/2000 | Suyama et al. | | 345/211 |
| 6,359,512 | B1 * | 3/2002 | Ivanov et al. | | 330/255 |
| 6,496,175 | B1 * | 12/2002 | Fukuo | | 345/99 |
| 6,600,483 | B1 * | 7/2003 | Akita et al. | | 345/204 |
| 6,717,468 | B1 * | 4/2004 | Jeong et al. | | 330/253 |
| 6,734,720 | B2 * | 5/2004 | Imai et al. | | 327/560 |
| 6,791,412 | B2 * | 9/2004 | Griffin | | 330/253 |
| 6,903,609 | B2 * | 6/2005 | Yasukouchi et al. | | 330/267 |
| 6,903,610 | B2 * | 6/2005 | Aoki et al. | | 330/267 |
| 2002/0122021 | A1 * | 9/2002 | Hector et al. | | 345/98 |
| 2002/0140648 | A1 * | 10/2002 | Watanabe et al. | | 345/87 |
| 2003/0142050 | A1 * | 7/2003 | Kim | | 345/87 |
| 2003/0189540 | A1 * | 10/2003 | Itakura et al. | | 345/89 |
| 2004/0036670 | A1 * | 2/2004 | Chung | | 345/99 |

* cited by examiner

*Primary Examiner*—Richard Hjerpe
*Assistant Examiner*—Mahmoud Fatahi Yar
(74) *Attorney, Agent, or Firm*—Harness, Dickey & Pierce, PLC

(57) ABSTRACT

A high slew rate amplifying circuit, for a TFT-type of LCD system, includes: an operational amplifier; a pull-up transistor connected to the output of the operational amplifier; a pull-down transistor to the output of the operational amplifier; a control circuit to selectively actuate the pull-up transistor and the pull-down transistor, e.g., according to at least one of a polarity signal and an output enable signal.

32 Claims, 8 Drawing Sheets

HIGH SLEW-RATE AMPLIFIER CIRCUIT FOR TFT-LCD SYSTEM

BACKGROUND OF THE INVENTION

A liquid crystal display (referred to as an LCD hereinafter) is one of the most widely used flat panel displays at present. The LCD generally includes two substrates having a plurality of electrodes for generating electric field formed thereon, a liquid crystal layer interposed between the substrates and polarizers for polarizing light attached to outer surfaces of the respective substrates. The brightness of light from the LCD is controlled by applying voltages to the electrodes to rearrange liquid crystal molecules. A plurality of switching devices such as thin film transistors (referred to as TFTs hereinafter), connected to the electrodes, for switching the voltages applied to the electrodes are provided on one of the substrates.

The LCDs include driving units having source driving units and gate driving units and a controller for controlling the driving circuits to supply voltages for the electrodes through the switching devices. In general, the controller is provided external to the substrates, and the driving circuits are placed either within or external to the substrate.

FIG. 1 is a block diagram of one configuration 1 of an output buffer for buffering applied voltages which are supplied to an LCD, according to the Background Art. In FIG. 1, the output buffer is implemented as N rail-to-rail (R2R) amplifiers 102 that each handle one bit of the N bit data being buffered in parallel by the output buffer. Though the R2R amplifier 102 implementation of FIG. 1 exhibits good output slew rates, it has problems that include: sinking large amounts of current; and consuming large areas of the substrate upon source driving unit formed, i.e., a big footprint.

FIG. 2 is a block diagram of another configuration of the output buffer, according to the Background Art, which attempts to improve upon the implementation of FIG. 1. In FIG. 2, rather than using N total R2R amplifiers 102 (as in FIG. 1), the output buffer is implemented so as to include a plurality of amplifying circuits 202 and a controller 208. Each amplifying circuit 202 includes: a 1-bit op-amp using P-type transistors (P-type op amp) 204; and a 1-bit op-amp formed of N-type transistors (N-type op-amp) 206.

As is known, to better avoid degrading the liquid crystal material in the LCD, a signal provided by the output buffer should oscillate around a common voltage, $V_{com}$, e.g., $V_{com}=\frac{1}{2} V_{DD}$, rather than be substantially constant. The P-type op-amp 204 handles the positive polarity portion of such an oscillating signal and the N-type op-amp 206 handles the negative polarity portion of such an oscillating signal. The outputs of the op-amps 204 and 206 are connected together. The controller 208 controls the op-amps 204 and 206 to alternate as follows: when the P-type op-amp 204 is on, the N-type op-amp 206 is off; and vice-versa.

The controller 208 turns on/off the op-amps 204 and 206 in response to a control signal CTL-H and a control signal CTL-L. The controller 208 generates the controls signals CTL-H and CTL-L based upon a polarity signal, POL generated by a timing controller (not shown) that is indicative of the polarity of the data passing through the output buffer.

FIGS. 3A-3F are timing diagrams for the output buffer implementation of FIG. 2, according to the Background Art. FIG. 3A is a waveform representing an output enable signal, e.g., which can be generated by the timing controller. FIG. 3B is a waveform representing the polarity signal, POL. FIGS. 3C and 3D are waveforms of the CTL-H signal (see FIG. 2) and the CTL-L signal (see FIG. 2), respectively, from the controller 208. FIG. 3E is a waveform (VH_PART; (see FIG. 2)) representing the output of the P-type op-amp 204. And FIG. 3F is a waveform (VL_PART; (see FIG. 2)) representing the output of the N-type op-amp 206.

Inspection of FIGS. 3C and 3E reveals that the VH_PART waveform tracks the CTL-H signal. Similarly, inspection of FIGS. 3D and 3F reveals that the VL_PART waveform tracks the CTL-L signal. But the tracking is not good: the VH_PART waveform (FIG. 3E) has a slow rising-time, as indicated by a reference number 302; and the VL_PART waveform (FIG. 3F) has a slow falling-time, as indicated by a reference number 304.

Slow rising/falling times produced by an output buffer are generally not desirable because, e.g., blurring of dynamic images on the LCD is proportional to slowness of rising/falling times. Thus, it is desirable to provide a high slew rate amplifying circuit for a TFT-LCD system.

SUMMARY

An embodiment of the invention provides a high slew rate amplifying circuit (e.g., for a TFT-LCD system). Such an amplifying circuit includes: an operational amplifier; a pull-up transistor connected to the output of the operational amplifier; a pull-down transistor to the output of the operational amplifier; a control circuit to selectively actuate the pull-up transistor and the pull-down transistor, respectively.

According to an embodiment of the present invention, the control circuit is operable to selectively actuate each of the pull-up and pull-down transistors, respectively, for one of the following: less than about ½ of the period of a polarity signal; or less than the period of a output enable signal. The control circuit is operable to selectively actuate each of the pull-up and pull-down transistors, respectively, for one of the following: less than about 1/20 period of the polarity signal; or less than about 1/10 of the period of the output enable signal. The control circuit is operable to selectively actuate each of the pull-up and pull-down transistors, respectively, for one of the following: less than about 1/200 of the period of the polarity signal; or less than about 1/100 of the period of the output enable signal.

According to an embodiment of the present invention, the control circuit includes: a first one-shot circuit to generate a first one-shot signal that determines actuation time of the pull-up transistor; and a second one-shot rising circuit to generate a second one-shot signal that determines actuation time of the pull-down transistor. The first and second one-shot signals are determined as a function of the output enable signal. Each of the first and second one-shot circuits includes at least one delay unit, respectively, to delay a transition in the respective one-shot signal relative to a transition in the output enable signal.

According to an embodiment of the present invention, the operational amplifier includes a high-part amplifying sub-circuit and a low-part amplifying sub-circuit. The high-part amplifying sub-circuit has voltage follower configuration including a plurality of transistors. The high-part amplifying sub-circuit further includes at least one capacitor. The low-part amplifying sub-circuit has voltage follower configuration including a plurality of transistors. The low-part amplifying sub-circuit further includes at least one capacitor.

According to an embodiment of the present invention, the pull-up transistor is connected to the output of the high-part amplifying sub-circuit and the pull-down transistor is connected to the output of the low-part amplifying sub-circuit.

A liquid crystal display (LCD) device is also provided, which includes: an LCD panel; and a plurality of source drivers connected to the panel; each of the source drivers including an output buffer.

Each output buffer includes: an operational amplifier; a pull-up transistor connected to the output of the operational amplifier; a pull-down transistor to the output of the operational amplifier; a control circuit to selectively actuate the pull-up transistor and the pull-down transistor, respectively.

Such an LCD device's control circuit is operable to selectively actuate each of the pull-up and pull-down transistors, respectively, for one of the following: less than about ½ of the period of a polarity signal; less than the period of an output enable signal; less than about 1/20 period of the polarity signal; less than about 1/10 of the period of the output enable signal; less than about 1/200 of the period of the polarity signal; or less than about 1/100 of the period of the output enable signal.

Additional features and advantages of the invention will be more fully apparent from the following detailed description of example embodiments, the accompanying drawings and associated claims.

The accompanying drawings are: intended to depict example embodiments of the invention and should not be interpreted to limit the scope thereof; and not to be considered as drawn to scale unless explicitly noted.

DETAILED DESCRIPTION OF PREFERRED EMBODIMENTS

Hereinafter, embodiments of the present invention will be described in detail with reference to the attached drawings. However, the embodiments of the present invention may be modified into various other forms, and the scope of the present invention must not be interpreted as being restricted to the embodiments. The embodiments are provided to more completely explain the present invention to those skilled in the art. The drawings are not to scale and so may exhibit exaggerations for clarity. Like numbers refer to like elements throughout.

An embodiment of the invention, in part, represents a recognition of the following. Adding one or more pull-up/pull-down transistors to the outputs of the P-type op-amp and the N-type op-amp can substantially improve rise/decay times. But if the pull-up/down transistors are operated for a similar or substantially the same duration as the op-amps, they also substantially increase the amount of current being sunk by the output buffer. However, if one or more such pull-up/down transistors are operated for a shorter duration than the op-amps, then significant improvements in rise/decay times can be achieved without corresponding significant increases in the amount of current being sunk by the output buffer.

Figure 4:
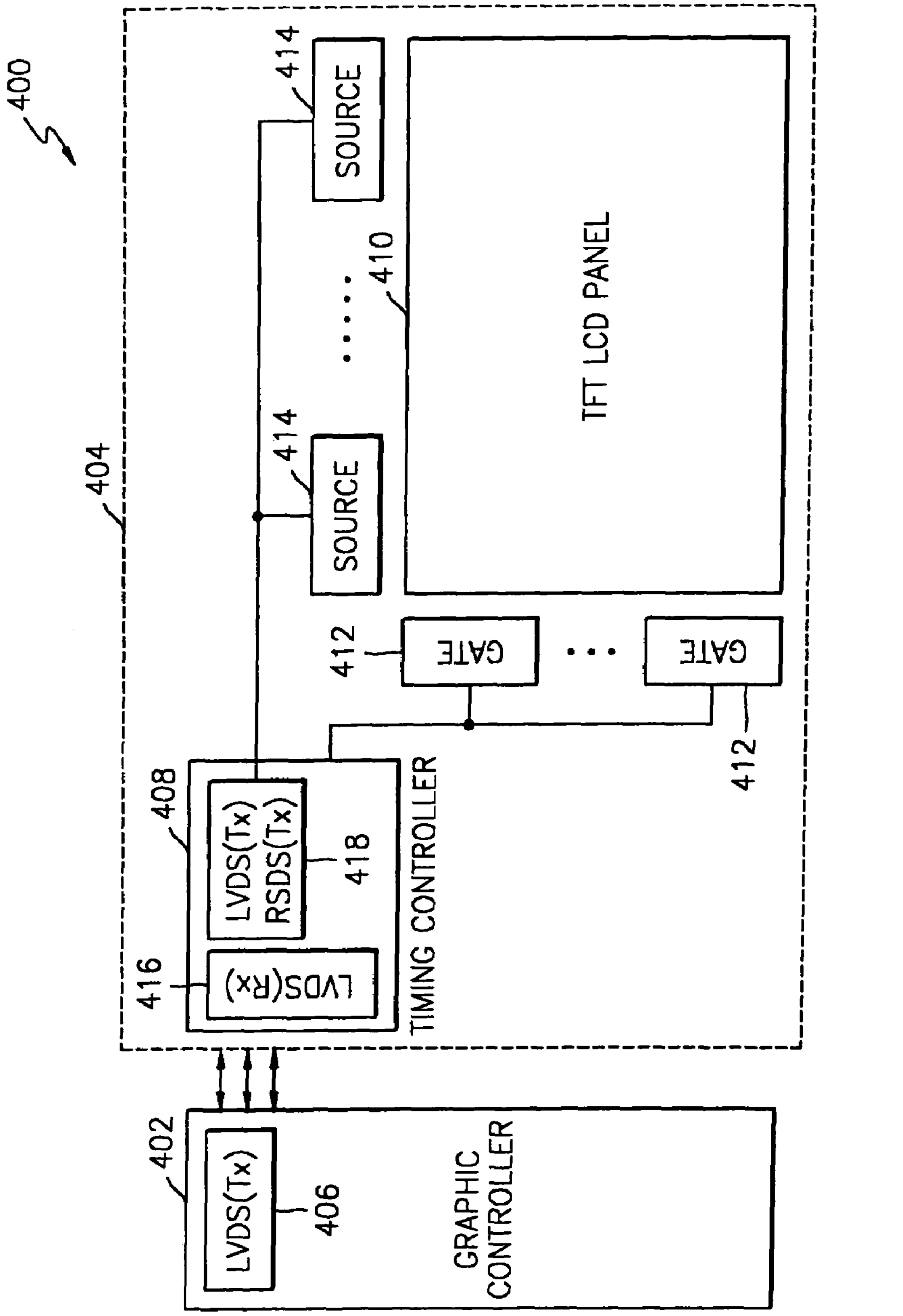
FIG. 4 is a block diagram of an LCD system according to an embodiment of the present invention.

FIG. 4 is a block diagram of an LCD system 400 according to an embodiment of the present invention. Referring to FIG. 4, the LCD system 400 includes a TFT-LCD system 404 and a graphic controller 402 for providing display data to the TFT-LCD system 404. According to an embodiment of the present invention, the graphic controller 402 includes a signal-sending unit 406 which communicates the display data to a corresponding signal-receiving unit 416 in the TFT-LCD system 404. Many signaling techniques, e.g., low voltage differential signaling (LVDS), can be used by the signal sending and receiving units 406 and 416.

Referring to FIG. 4, the TFT-LCD system 104 further includes: a timing controller 408 (of which the signal-receiving unit 416 is a part); gate driving units 412; source driving units 414; and a TFT-LCD panel 410. The timing controller 408 includes a signal-sending unit 418. After manipulating the display data received by the signal receiving unit 416, the timing controller 408 sends the manipulated data to the gate driving units 412 and the source driving units 414 via the signal-sending unit 118. The signal sending unit 418 can use the same signaling technique as the signal sending and receiving units 406 and 418, e.g., LVDS, or it can use other techniques, e.g., reduced swing differential signaling (RSDS) which is well known to those skilled in the art.

Figure 5:
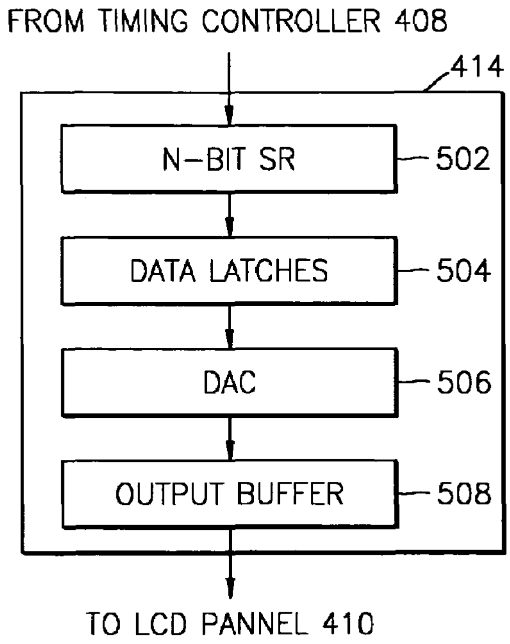
FIG. 5 is a block diagram of a source driving unit according to an embodiment of the present invention.

FIG. 5 is a block diagram of one of the source driving units 414 of FIG. 4. Each of the source driving units 414 includes: an N-bit shift register (SR) 502; data latches 504; a digital-to-analog converter (DAC) 506; and an output buffer 508. These units are generally cascade-connected such that data flows from the timing controller 408 to the TFT-LCD panel 410 through the following sequence of units: 502; 504; 506; and 508. The DAC 506 can be based primarily upon resistors, capacitors, or combination of resistors and capacitors.

Figure 6:
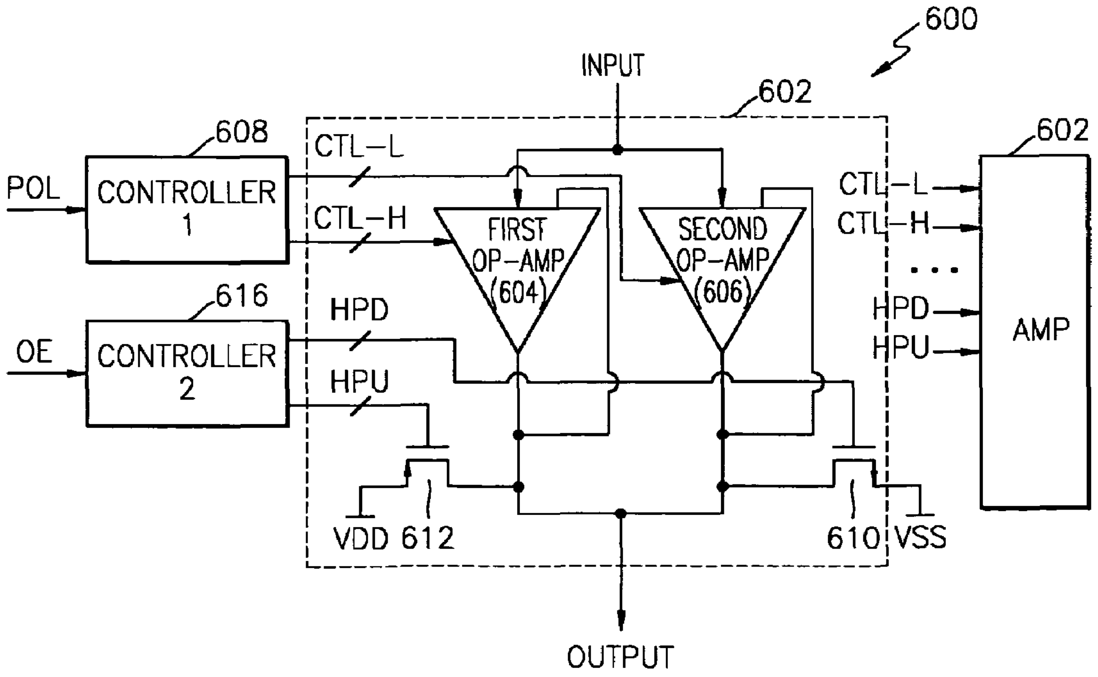
FIG. 6 is a block diagram of one configuration of the output buffer of FIG. 1, according to an embodiment of the invention.

FIG. 6 is a block diagram of an output buffer 600 according to an embodiment of the present invention, e.g., for a TFT-LCD system. The output buffer 600 corresponds to the output buffer 508 of FIG. 5.

The output buffer 600 of FIG. 6 includes: a plurality of amplifying circuits 602; a first controller 608; and a second controller 616. Each amplifying circuit 602 includes: a first op-amp 604; a second op-amp 606; at least one pull-up transistor 612; and at least one pull-down transistor 610. According to an embodiment of the present invention, the first op-amp 604 can be an N-bit (wherein N is positive integer) op-amp made of P-type transistors and the second op-amp 606 can be an N-bit (wherein N is positive integer) op-amp made of N-type transistors. For example, each of the N-bit op-amps can be a one-bit op-amp having a voltage-follower configuration shown in FIGS. 10A and 10B. The pull-up transistor 612 is preferably made of the same impurity type, e.g., P-type, as the first op-amp 604 so as to be more compatible. The pull-down transistor 610 is preferably made of the same impurity type, e.g., N-type, as the second op-amp 606 so as to be more compatible.

The first controller 608 of FIG. 6 generates control signals CTL-H and CTL-L for the first op-amp 604 and the second op-amp 606, respectively. The first op-amp 604 handles the positive polarity portion of the oscillating input signal (received, e.g., from a DAC such as DAC 506) and the second op-amp 606 handles the negative polarity portion of the oscillating input signal (again, received, e.g., from a DAC such as DAC 506). Likewise, the outputs of the first and second op-amps 604 and 606 are connected together to provide the output of the buffer 600.

The first controller 608 controls (or actuates) the first and second op-amps 604 and 606 to alternate as follows: when the first op-amp 604 is on, the second op-amp 606 is off; and vice-versa. As such, the first controller 608 turns on/off (actuates) the first and second op-amps 604 and 606 as follows: the first op-amp 604 via the control signal CTL-H; and the second op-amp 606 via the control signal CTL-L. The control signals CTL-H and CTL-L are generated by the first controller 608 based upon the polarity signal, POL (which, again, is indicative of the polarity of the data passing through the output buffers 600 and can be generated by the timing controller 408 (in FIG. 4).

In addition to being tied together, the outputs of the first and second op-amps 604 and 606 are: connected to the system source voltage, e.g., $V_{DD}$, via the pull-up transistor 612; and connected to the system ground voltage, e.g., $V_{SS}$, via the pull-down transistor 610.

The second controller 616 of FIG. 6 controls the pull-up and pull-down transistors 612 and 610 via control signals HPU (Half Pull-up) and HPD (Half Pull-down), respectively. As will be discussed further below, the pull-up and pull-down transistors 612 and 610 are operated for a shorter duration than the first and second op-amps 604 and 606, which achieves significant improvements in the rising/falling times without corresponding significant increases in the amount of current being sunk by the output buffer 600. The pull-up transistor 612 and the pull-down transistor 610 are operated via the control signals HPU and HPD, respectively, generated by the second controller 616.

Figure 7:
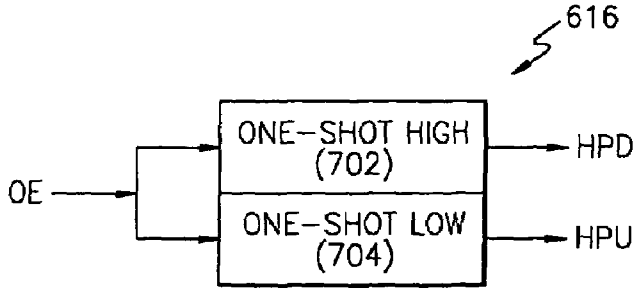
FIG. 7 is a block diagram of the controller of FIG. 6, according to an embodiment of the invention.

FIG. 7 is a block diagram of the second controller 616 of FIG. 6, according to an embodiment of the present invention.

The second controller 616 of FIG. 6 includes a one-shot-high circuit 702 and a one-shot-low circuit 704, which generate the control signals HPD and HPU, respectively, based upon the output enable signal OE (which, again, can be generated by the timing controller 408 of FIG. 4).

Figure 8A:
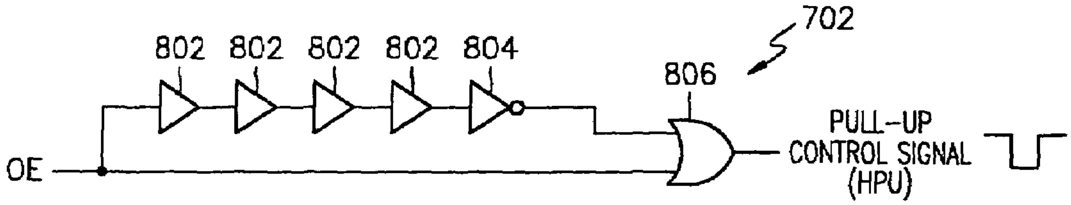
FIG. 8A is a block diagram of the one-shot-high circuit of FIG. 7, according to an embodiment of the invention.

FIG. 8A is a block diagram of the one-shot-high circuit 702 of FIG. 7, according to an embodiment of the present invention. The circuit 702 includes: a plurality of non-inverting (or buffering) op-amps 802 (here, for example, a total of four); an inverter 804; and an OR gate 806. The buffering op-amps 802 are cascade-connected between the output enable signal and the inverter 804. The output of the inverter 804 is connected to one of the inputs to the OR gate 806. The other input to the OR gate 806 directly receives the output enable signal OE. In operation, the one-shot-high circuit 702 delays the start of operation of the pull-up transistor 612 (in FIG. 6) relative to a start time of the first op-amp 604, and then operates the pull-up transistor 612 (in FIG. 6) for a relatively shorter duration than the P-type op-amp 604.

Figure 8B:
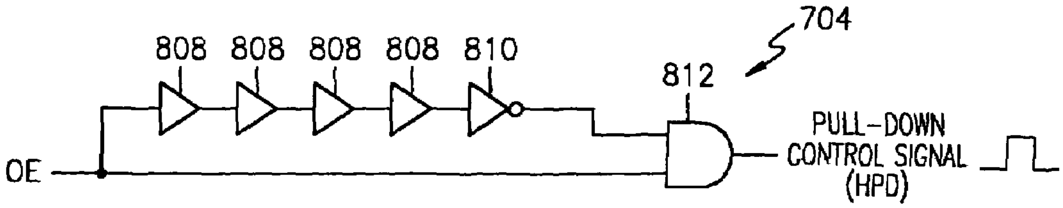
FIG. 8B is a block diagram of the one-shot-low circuit of FIG. 7, according to an embodiment of the invention.

FIG. 8B is a block diagram of the one-shot-low circuit 704 of FIG. 7, according to an embodiment of the present invention. The circuit 704 includes: a plurality of non-inverting (or buffering) op-amps 808 (here, for example, a total of four); an inverter 810; and an AND gate 812. The buffering op-amps 808 are cascade-connected between the output enable signal OE and the inverter 810. The output of the inverter 810 is connected to one of the inputs to the AND gate 812. The other input to the AND gate 812 directly receives the output enable signal. In operation, the one-shot-low circuit 704 delays the start of operation of the pull-down transistor 610 relative to a start time of the second op-amp 606, and then operates the pull-down transistor 610 for a relatively shorter duration than the second op-amp 606.

A specific numerical example of operation times/durations of the pull-up and pull-down transistors 612 and 610 will be provided. Assume that the period of the polarity signal, POL, is about 80 μ-sec. Recall that the first op-amp 604 is operated during the positive polarity portion thereof while the second op-amp 606 is operated during the negative polarity portion. As such, each of the op-amps 604 and 606 is turned on for about 40 μ-sec. Each of the pull-up transistor 612 and the pull-down transistor 610 can be turned on about 0.5 μ-sec after the polarity signal POL transitions from positive polarity to negative and vice-versa; this can be referred to as the delay time. And each of the pull-up transistor 612 and the pull-down transistor 610 can be kept on for a duration of about 0.1 μ-sec, after which each can be switched off until the next transition in the polarity signal POL.

The ordinarily-skilled artisan will understand that the delay time and the duration can, and should, vary according to the circumstances to which the output buffer 600 is applied. The choice of the duration can be viewed from the perspective of the economic maxim: diminishing returns. As the duration is increased, the improvement in slew rate becomes progressively more offset (in terms of advantages/disadvantages) by the increases in current sunk by the output buffer 600.

The pull-up and pull-down transistors 612 and 610 can be activated for a duration, respectively, that is: less than about 1/20 period of the polarity signal POL, or less than about 1/10 of the period of the output enable signal OE; or alternatively less than about 1/200 of the period of the polarity signal POL, or less than about 1/100 of the period of the output enable signal.

Figures 9A, 9B, 9C, 9D, 9E, 9F, 9G, 9H:
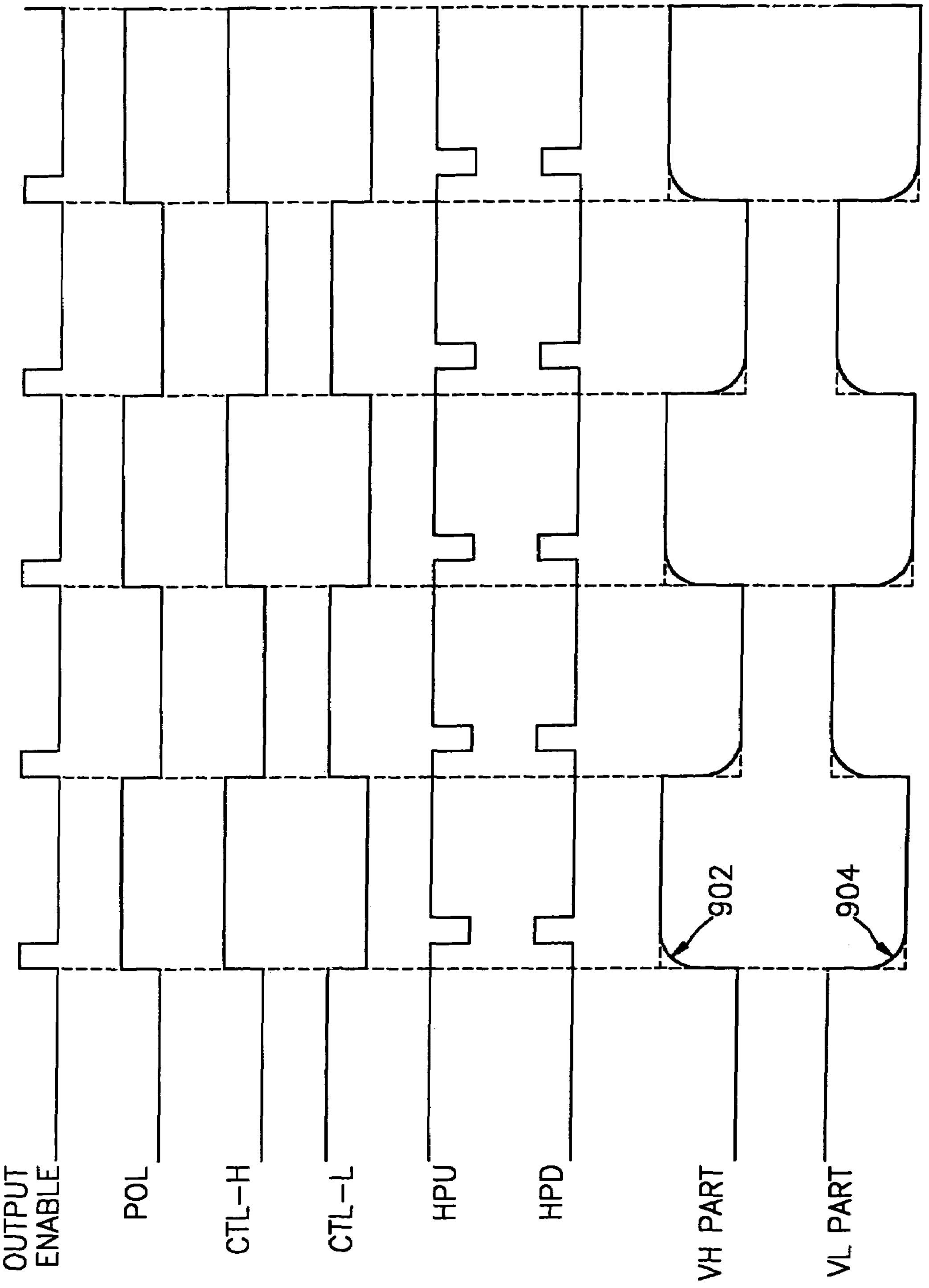
FIGS. 9A-9H are timing diagrams for the output buffer of FIG. 6, according to an embodiment of the invention.

FIGS. 9A-9H are timing diagrams for the output buffer of 600 of FIG. 6, according to an embodiment of the present invention. FIG. 9A is a waveform representing an output enable signal OE, e.g., which can be generated by the timing controller 408 (in FIG. 4). FIG. 9B is a waveform represent the polarity signal, POL. FIGS. 9C and 9D are waveforms representing the CTL-H signal and the CTL-L signal, respectively, from the controller 608 (in FIG. 6). FIG. 9E is a waveform representing the control signal HPU. FIG. 9F is a waveform representing the control signal HPD. FIG. 9G is a waveform (VH_PART) representing the output of the first op-amp 604 (as pulled up by the pull-up transistor 612 according to the control signal HPU). And FIG. 9H is a waveform (VL_PART) representing the output of the second op-amp 406 (as pulled down by the pull-down transistor 610 according to the control signal HPD).

Figure 1:
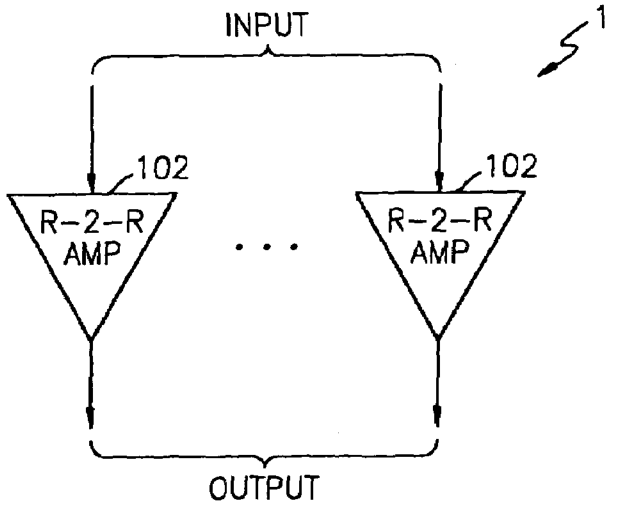
FIG. 1 (BACKGROUND ART)
FIG. 1 is a block diagram of one conventional configuration of an output buffer.
Figure 2:
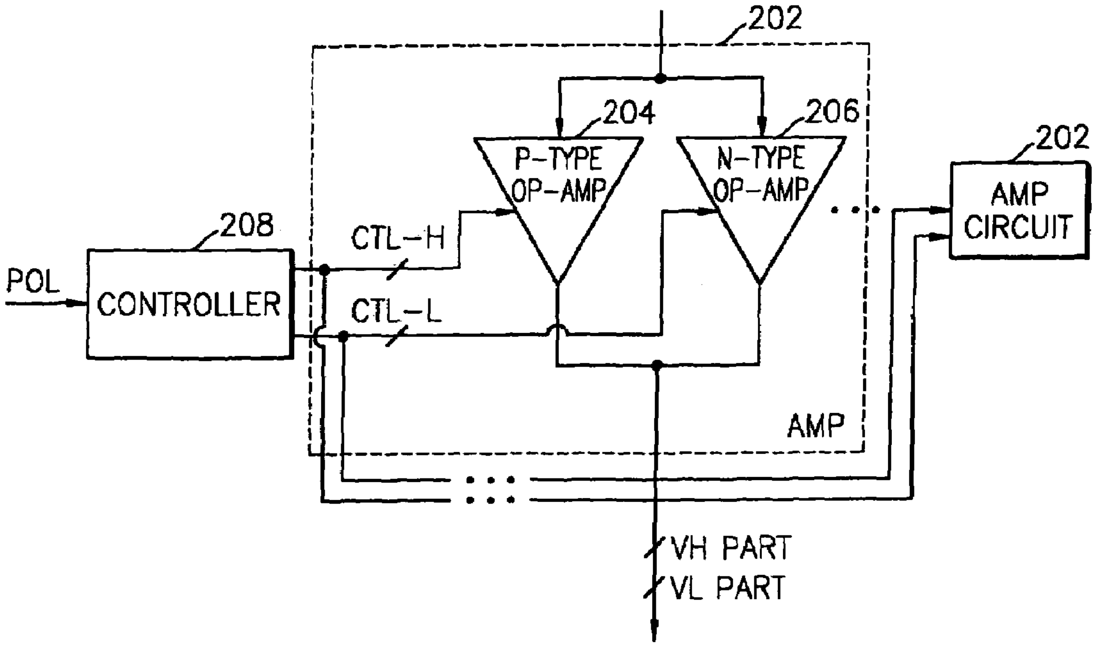
FIG. 2 (BACKGROUND ART)
FIG. 2 is a block diagram of another conventional configuration of an output buffer.
Figures 3A, 3B, 3C, 3D, 3E, 3F:
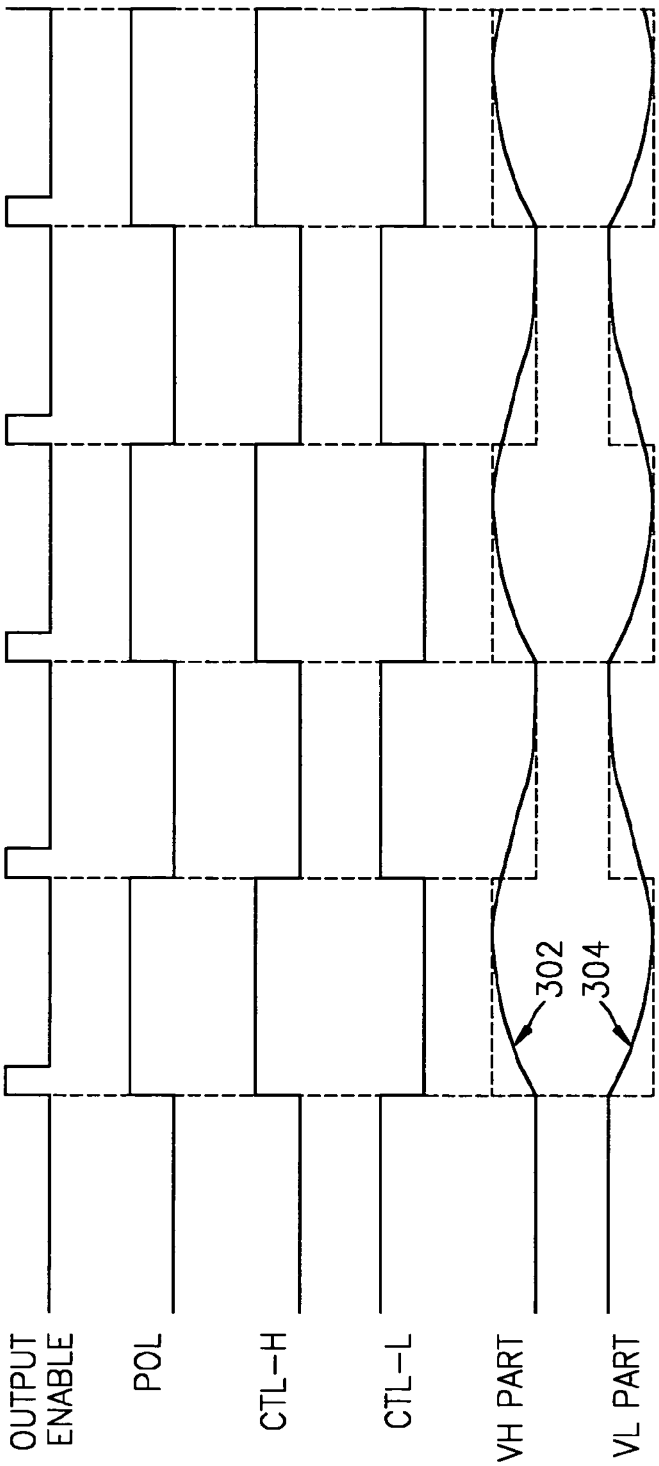
FIGS. 3A-3F are timing diagrams for the output buffer of FIG. 2.

Inspection of FIGS. 9C and 9G reveals that the VH_PART waveform tracks the CTL-H signal. Similarly, inspection of FIGS. 9D and 9H reveals that the VL_PART waveform tracks the CTL-L signal. In contrast to the Background Art, however, the tracking is better. The VH_PART waveform (FIG. 9G) has a high/fast rising-time, as indicated by reference number 902; and the VL_PART waveform (FIG. 9H) has a high/fast falling-rate, as indicated by reference number 904. Taking the view that an LCD panel 410 (in FIG. 4) is a large resistive-capacitive load, the high slew rate of the output buffer 600 indicates that the output buffer 600 correspondingly charges/discharges the resistive-capacitive load faster as contrasted with the output buffer of Background Art FIG. 2.

Figure 10A:
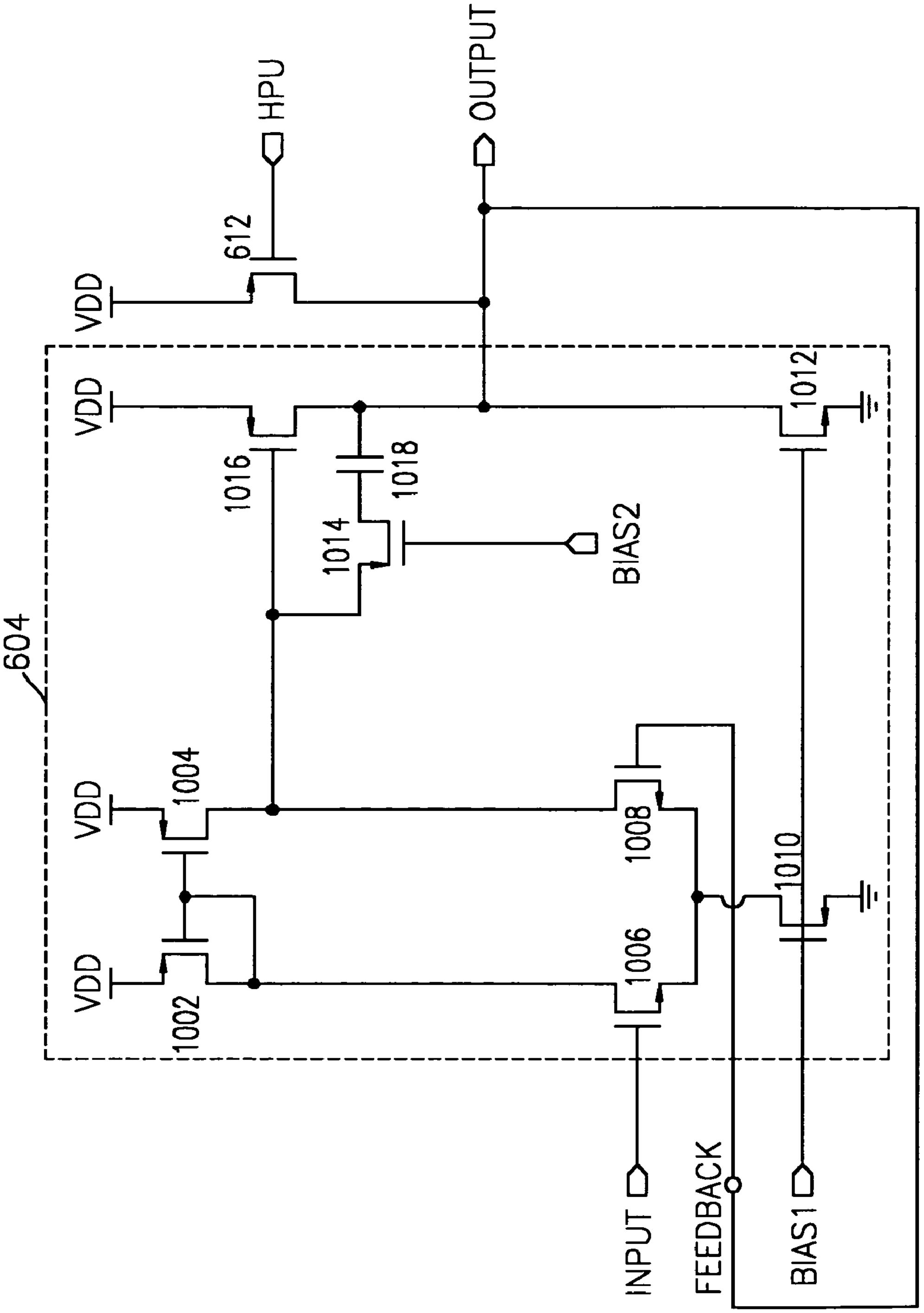
FIG. 10A is a schematic partially depicting an example implementation of the high-part amplifier and pull-up transistor of FIG. 6.

FIG. 10A is a schematic partially depicting an example implementation of the first op-amp 604 and the pull-up transistor 612 of FIG. 6. Similarly, FIG. 10B is a schematic partially depicting an example implementation of the second op-amp 606 and the pull-down transistor 610 of FIG. 6.

In FIG. 10A, the first op-amp 604 has voltage follower configuration which includes a plurality of transistors 1002-1016. The first op-amp 604 further can include at least one capacitor 1018. As the voltage follower configuration is well known to those skilled in the art, detailed description is omitted. Operationally in FIG. 10A, an INPUT signal at an input port is transformed to an OUTPUT signal (available at an output port) in response to the control signal HPU.

Figure 10B:
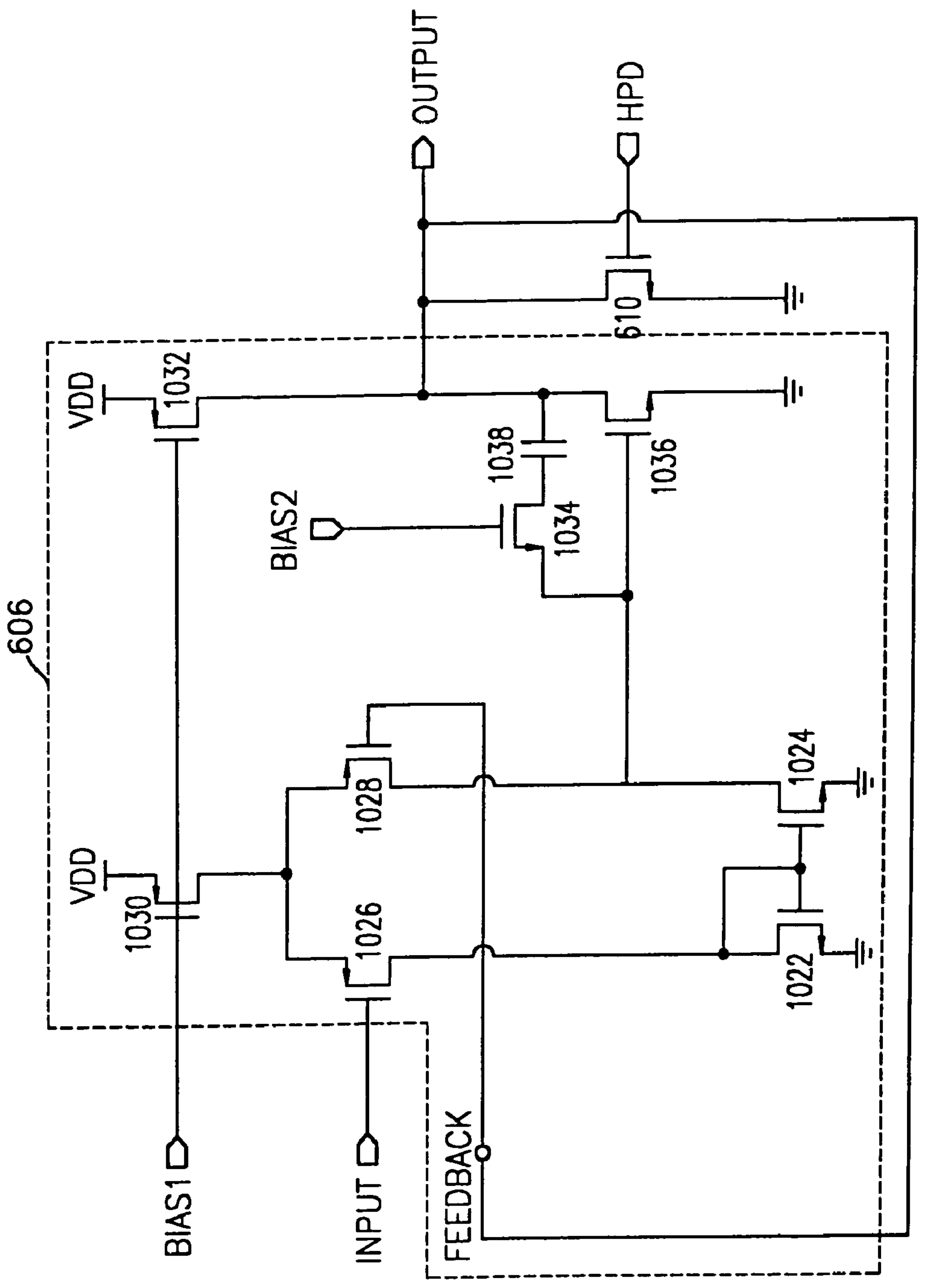
FIG. 10B is a schematic partially depicting an example implementation of the low-part amplifier and pull-down transistor of FIG. 6.

In FIG. 10B, the second op-amp 606 has voltage follower configuration which includes a plurality of transistors 1022-1036. The second op-amp 606 further can include at least one capacitor 1038. As the voltage follower configuration is well known to those skilled in the art, detailed description is omitted. Operationally in FIG. 10B, an INPUT signal at an input port is transformed to an OUTPUT signal (available at an output port) in response to the control signal HPD.

The invention may be embodied in other forms without departing from its spirit and essential characteristics. The described embodiments are to be considered only non-limiting examples of the invention. The scope of the invention is to be measured by associated claims. All changes which come within the meaning and equivalency of the claims are to be embraced within their scope.

What is claimed is:

1. A high slew rate amplifying circuit for a TFT-type of LCD system, the amplifying circuit comprising:
- an operational amplifier;
- a pull-up transistor connected to an output of the operational amplifier;
- a pull-down transistor connected to the output of the operational amplifier;
- a control circuit to selectively actuate the pull-up transistor and the pull-down transistor, respectively.

2. The amplifying circuit of claim 1, wherein the control circuit is operable to selectively actuate each of the pull-up and pull-down transistors, respectively, for one of the following: less than about ½ of the period of a polarity signal; or less than the period of an output enable signal.

3. The amplifying circuit of claim 2, wherein the control circuit is operable to selectively actuate each of the pull-up and pull-down transistors, respectively, for one of the following: less than about 1/20 period of the polarity signal; or less than about 1/10 of the period of the output enable signal.

4. The amplifying circuit of claim 3, wherein the control circuit is operable to selectively actuate each of the pull-up and pull-down transistors, respectively, for one of the following: less than about 1/200 of the period of the polarity signal; or less than about 1/100 of the period of the output enable signal.

5. A high slew rate amplifying circuit for a TFT-type of LCD system, the amplifying circuit comprising:
- an operational amplifier;
- a pull-up transistor connected to an output of the operational amplifier;
- a pull-down transistor connected to the output of the operational amplifier; and
- a control circuit to selectively actuate the pull-up transistor and the pull-down transistor, respectively, the control circuit including at least the following,
  - a first one-shot circuit to generate a first one-shot signal that determines actuation time of the pull-up transistor, and
  - a second one-shot rising circuit to generate a second one-shot signal that determines actuation time of the pull-down transistor.

6. The amplifying circuit of claim 5, wherein the first and second one-shot signals are determined as a function of an output enable signal.

7. The amplifying circuit of claim 5, wherein each of the first and second one-shot circuits includes at least one delay unit, respectively, to delay a transition in the respective one-shot signal relative to a transition in the output enable signal.

8. The amplifying circuit of claim 1, wherein the operational amplifier includes a high-part amplifying sub-circuit and a low-part amplifying sub-circuit.

9. The amplifying circuit of claim 8, wherein the high-part amplifying sub-circuit has voltage follower configuration including a plurality of transistors.

10. The amplifying circuit of claim 9, wherein the high-part amplifying sub-circuit further includes at least one capacitor.

11. The amplifying circuit of claim 8, wherein the low-part amplifying sub-circuit has voltage follower configuration including a plurality of transistors.

12. The amplifying circuit of claim 11, wherein the low-part amplifying sub-circuit further includes at least one capacitor.

13. The amplifying circuit of claim 8, wherein the pull-up transistor is connected to the output of the high-part amplifying sub-circuit and the pull-down transistor is connected to the output of the low-part amplifying sub-circuit.

14. The amplifying circuit of claim 8, wherein the control circuit is operable to selectively control the pull-up and pull-down transistors, respectively, based upon an output enable signal.

15. A high slew rate amplifying apparatus for a TFT-type of LCD system, the apparatus comprising:
- operational amplifying means;
- pull-up means for pulling up the output signal of the operational amplifying means;
- pull-down means for pulling down the output signal of the operational amplifying means;
- control means for selectively turning on and off the pull-up means and the pull-down means, respectively.

16. The amplifying apparatus of claim 15, wherein the control means is operable to control each of the pull-up and pull-down transistors, respectively, to be turned on for one of the following: less than about ½ of the period of a polarity signal; or less than the period of an output enable signal.

17. The amplifying circuit of claim 16, wherein the control means is operable to control each of the pull-up and pull-down transistors, respectively, to be turned on for one of the following: less than about 1/20 period of the polarity signal; or less than about 1/10 of the period of the output enable signal.

18. The amplifying circuit of claim 17, wherein the control means is operable to control each of the pull-up and pull-down transistors, respectively, to be turned on for one of the following: less than about 1/200 of the period of the polarity signal; or less than about 1/100 of the period of the output enable signal.

19. A high slew rate amplifying apparatus for a TFT-type of LCD system, the apparatus comprising:
- operational amplifying means;
- pull-up means for pulling up the output signal of the operational amplifying means;
- pull-down means for pulling down the output signal of the operational amplifying means;

control means for selectively turning on and off the pull-up means and the pull-down means, respectively, the control means includes at least the following, first one-shot means for providing a first one-shot signal that determines a duration that the pull-up means is turned on, and second one-shot means for providing a second one-shot signal that determines a duration that the pull-down means is turned on.

20. The amplifying apparatus of claim 19, wherein the first and second one-shot signals are based upon an output enable signal.

21. The amplifying apparatus of claim 19, wherein each of the first and second one-shot means includes at least one delay means, respectively, to delay turning of the respective one-shot means relative to a transition in the output enable signal.

22. The amplifying apparatus of claim 15, wherein the operational amplifying means includes high-part means and low-part means, the pull-up means being operable to pull-up the output of the high-part means and the pull-down means being operable to pull-down the output of the low-part means.

23. The amplifying apparatus of claim 15, wherein the control means is further operable for selectively controlling the pull-up and pull-down transistors, respectively, based upon an output enable signal.

24. A liquid crystal display (LCD) device comprising:

an LCD panel; and a plurality of source drivers connected to the panel;

each of the source drivers including an output buffer;

each output buffer including:

an operational amplifier;

a pull-up transistor connected to the output of the operational amplifier;

a pull-down transistor connected to the output of the operational amplifier;

a control circuit to selectively actuate the pull-up transistor and the pull-down transistor, respectively.

25. The LCD device of claim 24, wherein the control circuit is operable to selectively actuate each of the pull-up and pull-down transistors, respectively, for one of the following:

less than about ½ of the period of a polarity signal;

less than the period of an output enable signal;

less than about 1/20 period of the polarity signal;

less than about 1/10 of the period of the output enable signal;

less than about 1/200 of the period of the polarity signal; or less than about 1/100 of the period of the output enable signal.

26. A liquid crystal display (LCD) device comprising:

an LCD panel; and a plurality of source drivers connected to the panel;

each of the source drivers including an output buffer;

each output buffer including:

an operational amplifier;

a pull-up transistor connected to the output of the operational amplifier;

a pull-down transistor connected to the output of the operational amplifier;

a control circuit to selectively actuate the pull-up transistor and the pull-down transistor, respectively, the control circuit including at least the following, a first one-shot circuit to generate a first one-shot signal that determines actuation time of the pull-up transistor, and a second one-shot rising circuit to generate a second one-shot signal that determines actuation time of the pull-down transistor, the first and second one-shot signals being determined as a function of the output enable signal.

27. The LCD device of claim 26, wherein each of the first and second one-shot circuits includes at least one delay unit, respectively, to delay a transition in the respective one-shot signal relative to a transition in an output enable signal.

28. The LCD device of claim 24, wherein the operational amplifier includes a high-part amplifying sub-circuit and a low-part amplifying sub-circuit, the pull-up transistor being connected to the output of the high-part amplifying sub-circuit and the pull-down transistor being connected to the output of the low-part amplifying sub-circuit.

29. The LCD device of claim 24, wherein the control circuit is operable to selectively control the pull-up and pull-down transistors, respectively, based upon an output enable signal.

30. The amplifying circuit of claim 1, wherein the control circuit is operable so that the selective actuation achieves a combined operative duration of the pull-up and pull-down transistors that is significantly shorter than an operative duration of the operational amplifier.

31. The amplifying apparatus of claim 15, wherein the control means is operable so that the selective turning on and off achieves a combined operative duration of the pull-up means and the pull-down means that is significantly shorter than an operative duration of the operational amplifying means.

32. The LCD device of claim 24, wherein the control circuit is operable so that the selective actuation achieves a combined operative duration of the pull-up and pull-down transistors that is significantly shorter than an operative duration of the operational amplifier.

* * * * *